(12) United States Patent
Khalil et al.

(10) Patent No.: US 10,411,706 B1
(45) Date of Patent: Sep. 10, 2019

(54) WIDE-BAND DIGITAL BUFFER DRIVER

(71) Applicant: Government of the United States, as represented by the Secretary of the Air Force, Wright-Patterson AFB, OH (US)

(72) Inventors: Waleed Khalil, Dublin, OH (US); Brian P Dupaix, Columbus, OH (US); Paul M Watson, Dayton, OH (US); Aji G Mattamana, Xenia, OH (US); Shahriar Rashid, Columbus, OH (US); Tony Quach, Lebanon, OH (US); Wagdy Gaber Mahdi Hussein, Columbus, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/164,979

(22) Filed: Oct. 19, 2018

Related U.S. Application Data

(60) Provisional application No. 62/574,771, filed on Oct. 20, 2017, provisional application No. 62/656,452, filed on Apr. 12, 2018.

(51) Int. Cl.
*H03K 19/0185* (2006.01)

(52) U.S. Cl.
CPC ............... *H03K 19/018521* (2013.01)

(58) Field of Classification Search
CPC ...... H03K 17/00; H03K 17/102; H03K 19/00; H03K 19/00315; H03K 19/018521; H03K 3/00; H03K 3/012; H03K 3/356113

USPC .......................................................... 327/333
See application file for complete search history.

(56) References Cited

U.S. PATENT DOCUMENTS

| | | | |
|---|---|---|---|
| 4,877,976 | A | 10/1989 | Lach et al. |
| 5,705,940 | A | 1/1998 | Newman et al. |
| 9,054,940 | B2 | 6/2015 | Ma et al. |
| 9,559,883 | B2 | 1/2017 | Eliezer |
| 9,749,163 | B2 | 8/2017 | Koike-Akino et al. |
| 9,755,061 | B2 | 9/2017 | Ozaki et al. |

(Continued)

OTHER PUBLICATIONS

Kanan et al., "Pseudo-Complementary FET Logic (PCLF): A Low-Power Logic Family in GaAs," IEEE Journal of Solid-State Circuits, vol. 31, No. 7, Jul. 1996.

(Continued)

*Primary Examiner* — Lincoln D Donovan
*Assistant Examiner* — Dave Mattison
(74) *Attorney, Agent, or Firm* — AFMCLO/JAZ; Jeffrey R. Moore

(57) ABSTRACT

A wide-band digital buffer formed in a III-V substrate including a first transistor, a second transistor, a pull-up circuit shifts a t signal to a level of the first transistor. A first capacitor receives the signal, and passes at least a portion of the AC component of the signal to the first transistor. A resistor receives a first bias voltage, and passes it to the first transistor. A pull-down circuit shifts a second signal to a level of the second transistor. A second capacitor receives the second signal, and passes at least a portion of the AC component of the second signal to the second transistor. A second resistor receives a second bias voltage, and passes it to the second transistor.

16 Claims, 3 Drawing Sheets

(56) References Cited

U.S. PATENT DOCUMENTS

| | | | |
|---|---|---|---|
| 2011/0031953 | A1 | 2/2011 | Kanbe et al. |
| 2012/0181612 | A1 | 7/2012 | Yang et al. |
| 2012/0320642 | A1 | 12/2012 | Imanishi |
| 2016/0365859 | A1* | 12/2016 | Song .............. H03K 19/018514 |
| 2017/0012586 | A1 | 1/2017 | Zhu |

OTHER PUBLICATIONS

Wentzel et al., "A Dual-Band Voltage-Mode Class-D PA for 0.8/1.8 GHz Applications," 978-1-4673-2141-9/13, 2013 IEEE.

Rizzi et al., "Analysis and Characterization of GaAs Integrated Digital Circuits," https://www.researchgate.net/publication/242097436, Jan. 9, 2014.

Larue et al., "A Fully Integrated S/C Band Transmitter in 45nm CMOS/0.2um GaN Heterogeneous Technology," 2017 IEEE Compound Semiconductor IC Symposium Oct. 23-26, 2017.

Larue et al., "A Multifunction Transmitter based on a Fully-Digital CMOS/GaN Architecture in CAHI Technology," GOMATech Conference 12-15, Mar. 2018.

Mellor et al., "Capacitor-Coupled Logic Using GaAs Depletion-Mode FETs," IEEE Electronics Letters, vol. 16, Sep. 1980.

Quach et al., "Wideband High-Efficiency Digital Power Amplifier in GaN," 47th European Microwave Conference, Oct. 8-12, 2017.

Rashid et al., "A Wide-Band Complimentary Digital Driver for Pulse Modulated Single-Ended and Differential S/C Bands Class-E PAs in 130 nm GaAs Technology," 2016 IEEE Compound Semiconductor IC Symposium Oct. 23-26, 2016.

Rashid et al., "A Wideband Complimentary Digital Driver with Dynamic Biasing for Pulse Width Modulated PAs in Heterojunction Technologies," New Manuscript to be submitted for future publication—not prior art.

Walling et al., "Pulse-Width Modulated CMOS Power Amplifiers" IEEE Microwave Magazine, pp. 52-60, Feb. 2011.

* cited by examiner

WIDE-BAND DIGITAL BUFFER DRIVER

RELATED APPLICATIONS

This application claims all rights and priority on U.S. provisional patent application Ser. No. 62/574,771 filed 2017 Oct. 20 and 62/656,452 filed 2018 Apr. 12, the entirety of the disclosures of which is incorporated herein by reference.

GOVERNMENT RIGHTS STATEMENT

The invention described herein may be manufactured and used by or for the Government of the United States for all governmental purposes without the payment of any royalty.

FIELD OF THE INVENTION

This invention relates to the field of digital and radio frequency electronic circuitry. More particularly, this invention relates to digital buffers.

BACKGROUND OF THE INVENTION

For wireless communication applications, radio frequency (RF) Pulse-Width Modulation/Pulse-Position Modulation (PWM-PPM) signals are promising candidates to drive high efficiency switching mode power amplifiers (SMPAs). RF PWM-PPM signals are wide-band signals that require driving the relatively high input parasitic capacitance of the SMPA transistor. Therefore, a wide-band, high-speed, digital, III-V (such as GaAs, InP, and GaN) driver circuit is desirable to reduce amplitude and phase distortion.

For this class of SMPA, a sufficient input swing around the transistor threshold voltage is required to fully turn the switch-mode transistor from the on state to the off state, so as to achieve high drain efficiency. To obtain high output power, SMPAs typically consist of a large transistor periphery, such as a long unit gate width with multiple gate fingers, resulting in a high input parasitic capacitance.

CMOS technology is typically used to produce the digital switching pulses, which are operating at much lower and different voltage ranges in comparison to III-V technology voltages. In addition, RF PWM-PPM signals contain a large amount of harmonic content, such as up to the fifth harmonic, to realize a reasonable pulse shape. For example, if the RF PWM-PPM is operating at a 6 GHz fundamental frequency, the digital driver circuit should preferably operate at up to about 30 GHz so as to avoid distortion of the pulse train. Hence, a wide-band digital III-V driver is essentially needed.

However, III-V transistors typically operate in depletion mode (−ve threshold voltage), so the implementation of a push-pull digital inverter buffer without the benefit of the enhancement-mode transistor type (+ve threshold voltage) is difficult to realize, especially with varying duty-cycle input signals. Further, there are no complementary transistors in III-V technology, as there are in CMOS technology.

This situation leads to problems, such as in the interface between the CMOS and the III-V technologies, in that the switching signals coming from the CMOS circuits need to be shifted to different bias levels prior to input to the SMPAs.

What is needed, therefore, is a circuit design that tends to reduce issues such as those described above, at least in part.

SUMMARY OF THE INVENTION

The above and other needs are provided by a buffer formed in a III-V substrate, having first depletion mode transistor having a gate, a source, and a drain, where the drain of the first transistor is connected to a positive voltage source, and the source of the first transistor is connected to an output of the buffer. Also included is a second depletion mode transistor having a gate, a source, and a drain, where the drain of the second transistor is connected to the source of the first transistor and the output of the buffer, and the source of the second transistor is connected to a ground.

A pull-up circuit selectively shifts as needed a first level of a first signal to a second level of the first transistor, where the first signal has both AC and DC components. The pull-up circuit includes a first input that receives the first signal, where the first signal has pulses that are at a logical high when the first transistor is to turn on, and are at a logical low when the first transistor is to turn off. A first coupling capacitor has a first terminal connected to the first input that receives the first signal from the first input, and a second terminal connected to the gate of the first transistor that passes at least a portion of the AC component of the first signal to the first transistor. A first bias resistor has a first terminal connected to a first fixed voltage source for receiving a first bias voltage, and a second terminal connected to the gate of the first transistor for passing the first bias voltage to the first transistor.

A pull-down circuit selectively shifts as needed a third level of a second signal to a fourth level of the second transistor, where the second signal has both AC and DC components. The pull-down circuit includes a second input for receiving the second signal, where the second signal has pulses that are at the logical high when the second transistor is to turn on and are at the logical low when the second transistor is to turn off. A second coupling capacitor has a first terminal connected to the second input for receiving the second signal from the second input, and a second terminal connected to the gate of the second transistor for passing at least a portion of the AC component of the second signal to the second transistor. A second bias resistor has a first terminal connected to a second voltage source for receiving a second bias voltage, and a second terminal connected to the gate of the second transistor for passing the second bias voltage to the second transistor.

In some embodiments according to this aspect of the invention, a first resistance of the first bias resistor and a second resistance of the second bias resistor are substantially equal. In some embodiments, a first capacitance of the first coupling capacitor and a second capacitance of the second coupling capacitor are substantially equal. In some embodiments, the first signal and the second signal are complementary one to another. In some embodiments, the first input and the second input are connected to complementary outputs of a CMOS complementary digital driver formed in a silicon substrate. In some embodiments, multiple buffers are disposed in a chain of preceding buffers and succeeding buffers, where the outputs of two preceding buffers are connected one each to the first input and the second input of a succeeding buffer.

In some embodiments, a first DC tracking circuit has a third input for receiving the first signal, a fourth input for receiving the first bias voltage, and a second output for providing at least a portion of the DC component of the first signal and at least a portion of the first bias voltage to the first bias resistor. A second DC tracking circuit has a fifth input for receiving the second signal, a sixth input for receiving the second bias voltage, and a third output for providing at least a portion of the DC component of the second signal and at least a portion of the second bias voltage to the second bias resistor.

In some embodiments, the first DC tracking circuit includes a first DC extractor, and a first DC combiner. In some embodiments, the second DC tracking circuit includes a second DC extractor, and a second DC combiner.

In some embodiments, the first DC tracking circuit includes a first fixed bias resistor having a first terminal connected to the first bias voltage and a second terminal connected to the input of the first bias resistor, a first series resistor having a first terminal connected to the first input and a second terminal connected to the input of the first bias resistor, and a first filter capacitor having a first terminal connected to the ground and a second terminal connected to the input of the first bias resistor.

In some embodiments, the second DC tracking circuit includes a second fixed bias resistor having a first terminal connected to the second bias voltage and a second terminal connected to the input of the second bias resistor, a second series resistor having a first terminal connected to the second input and a second terminal connected to the input of the second bias resistor, and a second filter capacitor having a first terminal connected to the ground and a second terminal connected to the input of the second bias resistor.

In some embodiments, a first resistance of the first bias resistor and a second resistance of the second bias resistor are substantially equal. In some embodiments, a first resistance of the first fixed bias resistor and a second resistance of the second fixed bias resistor are substantially equal. In some embodiments, a first resistance of the first series resistor and a second resistance of the second series resistor are substantially equal. In some embodiments, a first capacitance of the first coupling capacitor and a second capacitance of the second coupling capacitor are substantially equal. In some embodiments, a first capacitance of the first filter capacitor and a second capacitance of the second filter capacitor are substantially equal.

In some embodiments, the first signal and the second signal are complementary one to another. In some embodiments, the first input and the second input are connected to complementary outputs of a CMOS complementary digital driver formed in a silicon substrate. In some embodiments, multiple buffers are disposed in a chain of preceding buffers and succeeding buffers, where the outputs of two preceding buffers are connected one to the first input and one to the second input of a succeeding buffer.

According to another aspect of the invention there is described a method for operating a buffer. A first signal and a second signal are received, where the first signal and the second signal are complimentary one to another, and have both an AC component and a DC component. The DC component is removed from the first signal to form a first remaining AC component. A first bias voltage is added to the first remaining AC component to form a first shifted signal. The first shifted signal is received at a gate of a first depletion mode III-V transistor, thereby allowing an output of the buffer that is connected to a source of the first transistor to be electrically connected through the first transistor to a positive voltage source connected to a drain of the first transistor when the first signal is at a logical high.

The DC component is removed from the second signal to form a second remaining AC component. A second bias voltage is added to the second remaining AC component to form a second shifted signal. The second shifted signal is received at a gate of a second depletion mode III-V transistor, thereby allowing the output connected to a drain of the second transistor to be electrically connected through the second transistor to a ground connected to a source of the second transistor when the second signal is at a logical high.

In various embodiments according to this aspect of the invention, the method is repeated by providing a signal from the output of the buffer as one of the first signal and the second signal on another buffer.

According to yet another aspect of the invention, there is described a method for dynamically operating a buffer. A first signal and a second signal are received, where the first signal and the second signal are complimentary one to another, and have both an AC component having pulses with widths, and a DC component. The DC component is removed from the first signal to form a first remaining AC component. A first bias voltage is added to the first remaining AC component to form a first shifted signal, where a first level of the first bias voltage is dynamically dependent at least in part on the widths of the pulses of the first signal. The first shifted signal is received at a gate of a first depletion mode III-V transistor, thereby allowing an output of the buffer that is connected to a source of the first transistor to be electrically connected through the first transistor to a positive voltage source connected to a drain of the first transistor when the first signal is at a logical high.

The DC component is removed from the second signal to form a second remaining AC component. A second bias voltage is added to the first remaining AC component to form a second shifted signal, where a second level of the second bias voltage is dynamically dependent at least in part on the widths of the pulses of the second signal. The second shifted signal is received at a gate of a second depletion mode III-V transistor, thereby allowing the output connected to a drain of the second transistor to be electrically connected through the second transistor to a ground connected to a source of the second transistor when the second signal is at a logical high.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION OF THE INVENTION

Figure 1A:
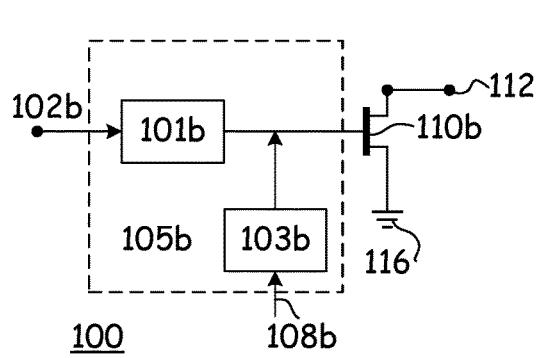
FIGS. 1A, 1B, and 1C are functional block diagrams and schematics of a buffer according to a first embodiment of the present invention.

The various embodiments presented below describe circuits that are implemented in III-V substrates using N-type depletion-mode transistors. Because only depletion-mode transistors are used, there are no pull-up/pull-down buffers that can be easily designed using NMOS and PMOS transistors (directly DC coupled to the input).

In a first embodiment, a pull-up/pull-down buffer circuit is described, with a level-shifting circuit that filters a direct current (DC) portion of an input signal and passes at least some of an alternating current (AC) portion of the input signal, and then adds to the passed AC portion a DC-only component from a bias voltage that is sufficient to switch a III-V transistor. In a second embodiment, a DC tracking circuit is added to the DC level shifting circuit. The DC tracking circuit includes a DC extractor that removes an AC portion of the input signal and passes at least some of a DC portion of the input signal. The DC tracking circuit also includes a DC voltage combiner circuit that adds some of a bias voltage to the extracted DC portion of the input signal that is output by the DC extractor. This combined DC voltage is proportional to the pulse widths of the input signal, and is input to the DC level shifting circuit as a dynamic bias voltage.

In some embodiments, the input signals to the pull-up/pull-down portions of the buffer are complementary to each other, meaning one is high when the other is low. The III-V transistor connected to the pull-up side of the circuit switches a high voltage source to the output of the buffer, and the III-V transistor connected to the pull-down side of the circuit switches a ground source to the output of the buffer, thus pulling the output high or low as desired, but never attempting to do so at the same time, because of the complimentary nature of the input signals.

In some embodiments, one or more of these buffers can be staged to drive a relatively high capacitance SMPA. For example, designing backwards from a relative size of 8 W of the SMPA, and assuming a desired chain of two buffers between the SMPA and the initial driver of the silicon CMOS driver that has a relative size of W, a first buffer on the III-V substrate could have a relative size of 2 W, and a second buffer could have a relative size of 4 W. Thus, each driver is only driving a circuit with a capacitance that is twice its own capacitance, rather than the initial CMOS circuit trying to drive a relative capacitance of 8X.

The specific aspects of these embodiments are described with greater specificity below.

In the figures, a "b" suffix on a given reference number is generally used to indicate a given element on the pull-down side of the depicted circuit, and an "a" suffix on a given reference number is generally used to indicate a given element on the pull-up side of the depicted circuit. When neither "a" nor "b" is recited with a reference number, it generically refers to the like component on either the pull-up or the pull-down side of the circuit, or a component that is shared between the pull-up and the pull-down sides of the circuit.

In a first embodiment, as functionally depicted in FIG. 1A, a DC level shifter 105 is placed between an input signal 102 and a transistor 110, all of which are fabricated in a III-V substrate. The DC level shifter 105 shifts the AC component of the input signal 102 from a first DC bias level, such as that output from a silicon CMOS driver circuit (not depicted), to a second DC bias level that is required for a III-V device, such as transistor 110.

Figure 1B:
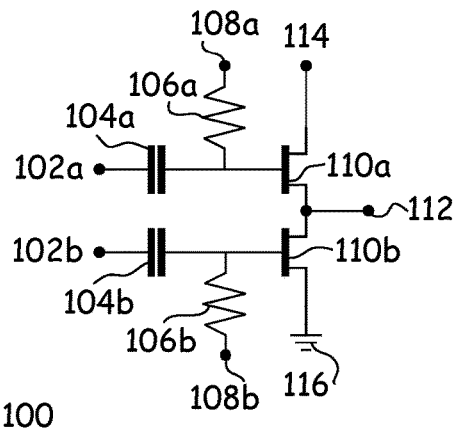

In some embodiments, as functionally depicted in FIG. 1B, the DC level shifter 105 is comprised of a DC blocking component 101 that is used to block a DC component of the input signal 102, and a DC bias regulator 103 that is used to conduct the DC bias voltage 108. When the output of the DC blocking component 101 and the DC bias regulator 103 are joined as the input to the III-V pull-down transistor 110, for example, the combined signal is at the proper voltage level to switch the III-V transistor 110b, while the AC component from the input signal 102b is carried through.

Complementary switching signals 102a and 102b—readily available from typical silicon CMOS modulators, are used to switch off the pull-up transistor 110a when the pull-down transistor 110b turns on, and vice-versa. In this manner, the rail 114 to rail 116 static current loss is significantly reduced.

Specifically, when 102b is low and 102a is high, the pull-up network connects the output signal 112 to the voltage source $V_{DD}$ 114. The pull-down network is open at this same time (no current flow through the transistor 110b), and as a result there's no unwanted rail to rail leakage current from 114 to 116. Similarly, the pull-up network is open when the pull-down current discharges the capacitive load to the ground $-V_{SS}$ 116, when input 102b is high and 102a is low. Therefore, output 112 swings from $V_{DD}$ to $-V_{SS}$ and there is no static power loss in this buffer 100, because the CMOS signals 102a and 102b open and close the pull-up and pull-down circuits only one at a time, in an alternating fashion.

Figure 1C:
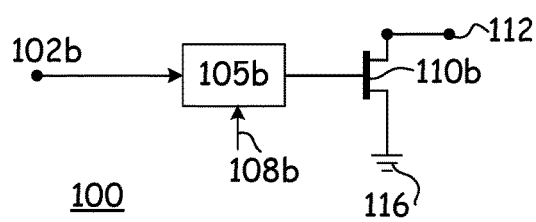

The DC blocking component 101 can be implemented, for example, as depicted in FIG. 1C, with the coupling capacitor 104, and the DC bias regulator 103 can be implemented, for example, with the bias resistor 106.

The inverting buffer depicted in FIG. 1C is one of the possible implementations of the conceptual views shown in FIGS. 1A and 1B. The pull-up and pull-down transistors 110 are both N-channel, III-V, depletion mode transistors in this example. The coupling capacitor 104 and the bias resistor 106 form the DC level shifter 105, where coupling capacitors 104 remove DC content from the input signal 102, and bias resistors 106 introduce the desired bias levels from DC bias voltage inputs 108 to the corresponding gates of the transistors 110. In this buffer circuit 100, the transistors 110 are employed as switches.

Figure 2A:
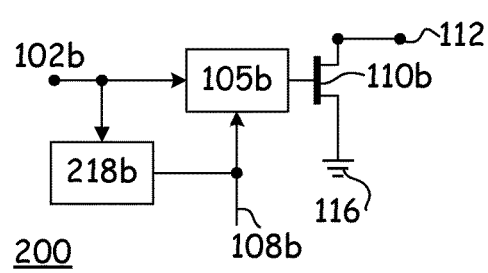
FIGS. 2A, 2B, and 2C are functional block diagrams of a buffer according to a second embodiment of the present invention.
Figure 2B:
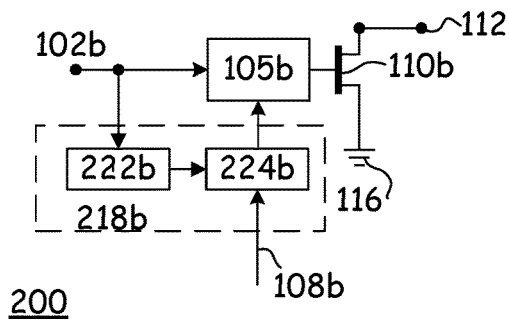
Figure 2C:
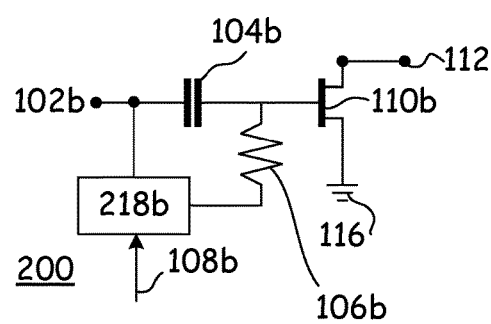

FIGS. 2A, 2B, and 2C depict further embodiments where a DC tracking circuit 218 is added to the circuit 100, thus creating the circuit 200. As depicted in FIG. 2A, DC tracker 218 is incorporated in the bias tee of buffer 100 of FIG. 1A to dynamically adapt the bias levels of the switching signal that is delivered to the transistors 110, based on the pulse widths in the input signals 102, which are essential for applications involving pulse width variations, such as PWM signals. The bias level delivered to the level shifter 105 is dynamic, since a portion of it is coming from the pulse-width dependent output of DC tracker 218, as explained in greater detail hereafter.

The DC tracker 218 is comprised of a DC extractor 222 and a DC combiner 224, as depicted in FIG. 2B. The DC extractor 222 removes an AC component of the input signal 102. The DC combiner 224 adds at least a portion of the bias voltage 108 to at least a portion of the DC component of the input signal 102, and outputs the dynamic bias voltage to the voltage shifter 105. In this manner, the DC level of the shifted signal delivered to the transistor 110 is variable depending upon the pulse width of the input signal 102.

Figure 3:
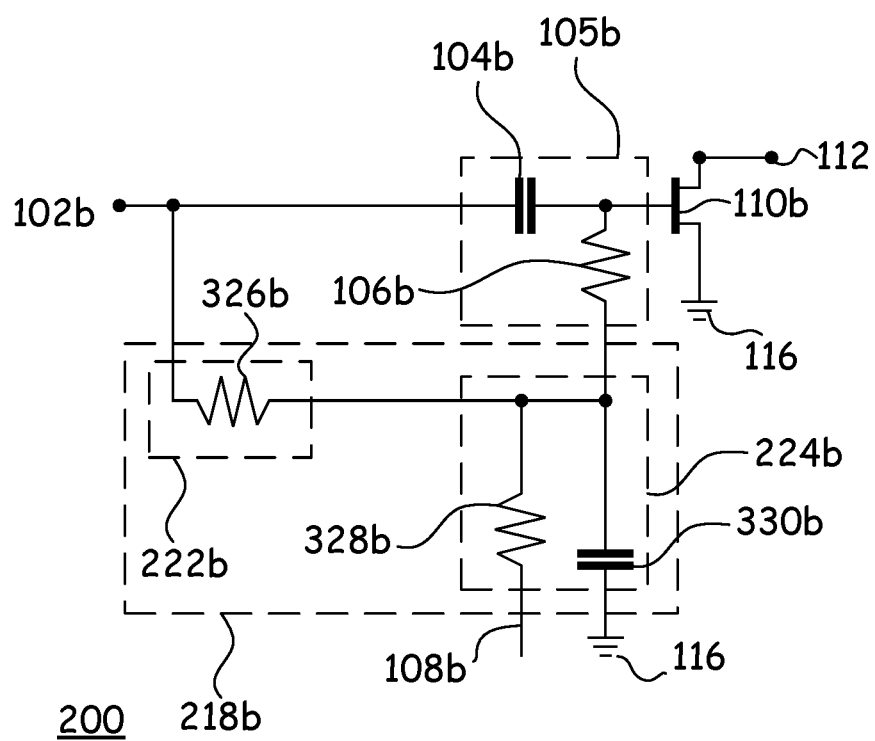
FIG. 3 is a schematic of a buffer according to the second embodiment of the present invention.

FIG. 3 depicts one embodiment of a circuit 200. The complimentary AC/DC composite input signals are received at 102. Signals at 102 are each delivered to two parts of the circuit 200. The first parts are the level-shifters 105, and the second parts are the DC tracking circuits 218—more specifically to the series resistor 326, which is a part of both the DC extractor 222 and the DC combiner 224. The DC combiner 224 also receives the bias voltage 108, as passed through a fixed bias resistor 328. The DC extractor 222 also includes a filter capacitor 330, one terminal of which is connected to the ground 116.

The combined output signal from the DC voltage combiner 224, and thus from the DC tracker circuit 218, is input to the DC level shifter 105, through what can now be called the dynamic bias resistor 106. The DC level shifter 105 works in the same way as described above.

Figure 4:
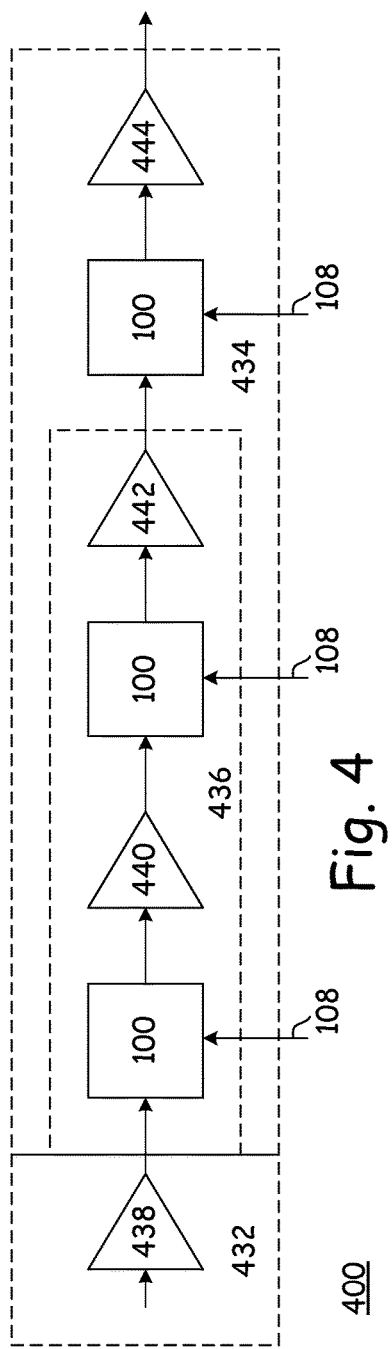
FIG. 4 is a functional block diagram of the first embodiment of the buffer integrated into a buffer chain according to an embodiment of the invention.
Figure 5:
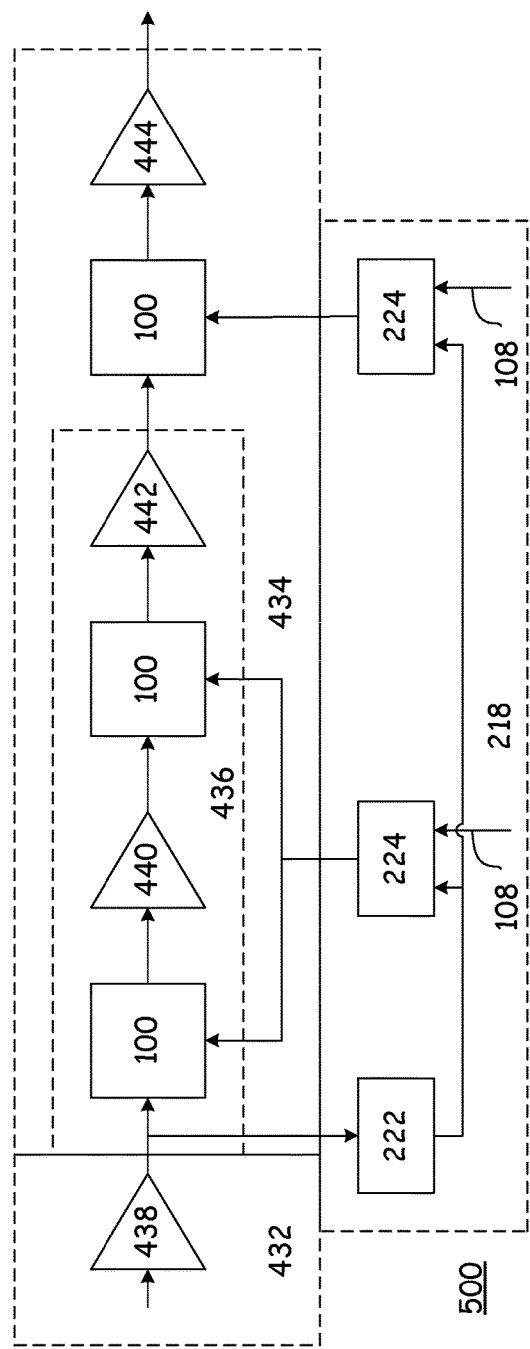
FIG. 5 is a functional block diagram of the second embodiment of the buffer integrated into a buffer chain according to an embodiment of the invention.

FIGS. 4 and 5 depict CMOS drivers 438 implemented in silicon 432, which deliver the input signal 102 to the circuits 100 as described above, which are implemented in a III-V compound 434, such as GaN. Pre-amplifying buffer section 436 (including two buffer stages 100 as depicted in each of FIGS. 4 and 5) provide input to the final stage, which includes a level shifter 105b and a SMPA 444.

The dynamic bias levels can be shared among multiple stages of similar circuits, as depicted in FIG. 5. Here, the dynamic biasing block is extracting at least a portion of the DC component of the incoming RF signal 102 ($V_{in,DC}$). $V_{in,DC}$ is dependent on the pulse-width of the signal 102. In addition, the dynamic biasing adds this extracted portion of $V_{in,DC}$ to at least a portion of the fixed bias level 108 for the buffers and the SMPA respectively.

So, $V_{in,DC}$ is shared between two buffers 100, which is possible because the same signals are flowing down the chain. In this manner, the space overhead for the overall circuit 500 can be considerably reduced in comparison to other level shifter circuits that precede each stage. Therefore, the proposed dynamic bias tee would also be more efficient space-wise for multi-stage circuits and systems.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

REFERENCE NUMBER INDEX

100 Pull-up/pull-down buffer with DC level shifter
101 DC blocking component
102 Signal input
103 DC bias regulator
104 Coupling capacitor
105 DC level shifter
106 Bias resistor
108 DC bias voltage input
110 III-V depletion mode transistor
112 Buffer output
114 High voltage source
116 Ground source
200 Pull-up/pull-down buffer with DC level shifter and DC tracker
218 DC tracker
222 DC extractor
224 DC combiner
326 Series resistor
328 Fixed bias resistor
330 Filter capacitor
400 Switching CMOS driver, buffer chain, and SMPA
432 Silicon substrate
434 III-V substrate
436 Buffer chain
438 CMOS driver
444 Switching mode power amplifier (SMPA)
500 Switching CMOS driver, buffer chain, DC tracker, and SMPA

What is claimed is:

1. A buffer formed in a III-V substrate, the buffer comprising:
a first depletion mode transistor having a gate, a source, and a drain, where the drain of the first transistor is connected to a positive voltage source, and the source of the first transistor is connected to an output of the buffer,
a second depletion mode transistor having a gate, a source, and a drain, where the drain of the second transistor is connected to the source of the first transistor and the output of the buffer, and the source of the second transistor is connected to a ground,
a pull-up circuit for selectively shifting as needed a first level of a first signal to a second level of the first transistor, the first signal having both AC and DC components, the pull-up circuit comprising,
a first input for receiving the first signal, the first signal having pulses that are at a logical high when the first transistor is to turn on and are at a logical low when the first transistor is to turn off,
a first coupling capacitor having a first terminal connected to the first input for receiving the first signal from the first input, and a second terminal connected to the gate of the first transistor for passing at least a portion of the AC component of the first signal to the first transistor, and
a first bias resistor having a first terminal connected to a first fixed voltage source for receiving a first bias voltage, and a second terminal connected to the gate of the first transistor for passing the first bias voltage to the first transistor, and
a pull-down circuit for selectively shifting as needed a third level of a second signal to a fourth level of the second transistor, the second signal having both AC and DC components, the pull-down circuit comprising,
a second input for receiving the second signal, the second signal having pulses that are at the logical high when the second transistor is to turn on and are at the logical low when the second transistor is to turn off,
a second coupling capacitor having a first terminal connected to the second input for receiving the second signal from the second input, and a second terminal connected to the gate of the second transistor for passing at least a portion of the AC component of the second signal to the second transistor, and
a second bias resistor having a first terminal connected to a second voltage source for receiving a second bias voltage, and a second terminal connected to the gate of the second transistor for passing the second bias voltage to the second transistor;
a first DC tracking circuit having a third input for receiving the first signal, a fourth input for receiving the first bias voltage, and a second output for providing at least a portion of the DC component of the first signal and at least a portion of the first bias voltage to the first bias resistor, and a second DC tracking circuit having a fifth input for receiving the second signal, a sixth input for receiving the second bias voltage, and a third output for providing at least a portion of the DC component of the second signal and at least a portion of the second bias voltage to the second bias resistor.

2. The buffer of claim 1, wherein a first resistance of the first bias resistor and a second resistance of the second bias resistor are substantially equal.

3. The buffer of claim 1, wherein a first capacitance of the first coupling capacitor and a second capacitance of the second coupling capacitor are substantially equal.

4. The buffer of claim 1, wherein the first signal and the second signal are complementary one to another.

5. The buffer of claim 1, wherein the first input and the second input are connected to complementary outputs of a CMOS complementary digital driver formed in a silicon substrate.

6. The buffer of claim 1, wherein:
the first DC tracking circuit comprises,
a first DC extractor, and
a first DC combiner, and
the second DC tracking circuit comprises,
a second DC extractor, and
a second DC combiner.

7. The buffer of claim 1, wherein:
the first DC tracking circuit comprises,
a first fixed bias resistor having a first terminal connected to the first bias voltage and a second terminal connected to the input of the first bias resistor,
a first series resistor having a first terminal connected to the first input and a second terminal connected to the input of the first bias resistor, and
a first filter capacitor having a first terminal connected to the ground and a second terminal connected to the input of the first bias resistor, and
the second DC tracking circuit comprises,
a second fixed bias resistor having a first terminal connected to the second bias voltage and a second terminal connected to the input of the second bias resistor,
a second series resistor having a first terminal connected to the second input and a second terminal connected to the input of the second bias resistor, and
a second filter capacitor having a first terminal connected to the ground and a second terminal connected to the input of the second bias resistor.

8. The buffer of claim 7, wherein a first resistance of the first bias resistor and a second resistance of the second bias resistor are substantially equal.

9. The buffer of claim 7, wherein a first resistance of the first fixed bias resistor and a second resistance of the second fixed bias resistor are substantially equal.

10. The buffer of claim 7, wherein a first resistance of the first series resistor and a second resistance of the second series resistor are substantially equal.

11. The buffer of claim 7, wherein a first capacitance of the first coupling capacitor and a second capacitance of the second coupling capacitor are substantially equal.

12. The buffer of claim 7, wherein a first capacitance of the first filter capacitor and a second capacitance of the second filter capacitor are substantially equal.

13. The buffer of claim 7, wherein the first signal and the second signal are complementary one to another.

14. The buffer of claim 7, wherein the first input and the second input are connected to complementary outputs of a CMOS complementary digital driver formed in a silicon substrate.

15. The buffer of claim 7, wherein multiple buffers are disposed in a chain of preceding buffers and succeeding buffers, where the outputs of two preceding buffers are connected one to the first input and one to the second input of a succeeding buffer.

16. A method for operating a buffer, the method comprising the steps of:
receiving a first signal and a second signal, where the first signal and the second signal are complimentary one to another, and have both an AC component and a DC component,
removing the DC component from the first signal to form a first remaining AC component,
adding a first bias voltage to the first remaining AC component to form a first shifted signal,
receiving the first shifted signal at a gate of a first depletion mode III-V transistor, thereby allowing an output of the buffer that is connected to a source of the first transistor to be electrically connected through the first transistor to a positive voltage source connected to a drain of the first transistor when the first signal is at a logical high,
removing the DC component from the second signal to form a second remaining AC component,
adding a second bias voltage to the second remaining AC component to form a second shifted signal, and
receiving the second shifted signal at a gate of a second depletion mode III-V transistor, thereby allowing the output connected to a drain of the second transistor to be electrically connected through the second transistor to a ground connected to a source of the second transistor when the second signal is at a logical high; and wherein the method is repeated by providing a signal from the output of the buffer as one of the first signal and the second signal on another buffer.

* * * * *